US007098685B1

(12) United States Patent  (10) Patent No.: US 7,098,685 B1
Agrawal et al.  (45) Date of Patent: Aug. 29, 2006

(54) SCALABLE SERIALIZER-DESERIALIZER ARCHITECTURE AND PROGRAMMABLE INTERFACE

(75) Inventors: Om P. Agrawal, Los Altos, CA (US); Bai Nguyen, Union City, CA (US); Kuang Chi, San Jose, CA (US); Brad Sharpe-Geisler, San Jose, CA (US); Giap Tran, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 463 days.

(21) Appl. No.: 10/619,645

(22) Filed: Jul. 14, 2003

(51) Int. Cl.
G06F 7/38 (2006.01)
H03K 19/173 (2006.01)
H03K 19/177 (2006.01)
H03K 19/00 (2006.01)
H01L 25/00 (2006.01)

(52) U.S. Cl. ............................ 326/38; 326/37; 326/41; 326/47; 326/101

(58) Field of Classification Search ............ 326/37–38, 326/41, 47, 101
See application file for complete search history.

(56) References Cited

U.S. PATENT DOCUMENTS 5,212,652 A * 5/1993 Agrawal et al. ............... 326/41
5,877,632 A 3/1999 Goetting et al.
6,031,428 A 2/2000 Hill
6,218,858 B1 4/2001 Menon et al.
6,417,692 B1 7/2002 Shiflet
6,480,026 B1 11/2002 Andrews et al.
6,542,096 B1 * 4/2003 Chan et al. ................. 341/100
6,894,530 B1 * 5/2005 Davidson et al. ............. 326/38

FOREIGN PATENT DOCUMENTS

WO  WO 01/69837  3/2001

OTHER PUBLICATIONS

"Converting Wide, Parallel Data Buses to High Speed Serial Links," by Jason Konstas, International IC '99, Conference Proceedings, pp. 19-30, no month.
U.S. Appl. No. 10/023,226 to Am P. Agrawal et al., filed Dec. 14, 2001, with Preliminary Amendment.

* cited by examiner

Primary Examiner—Rexford Barnie
Assistant Examiner—Jason Crawford
(74) Attorney, Agent, or Firm—MacPherson Kwok Chen & Heid LLP; Greg J. Michelson

(57) ABSTRACT

Systems and methods are disclosed to provide programmable input/output functionality for a programmable logic device. For example, in accordance with one embodiment of the present invention, a programmable interface selectively employs a scalable serializer-deserializer and clock and data recovery circuit. The programmable interface further includes programmable input/output buffers and embedded memory to allow the programmable logic device to support a wide range of input/output interface standards.

20 Claims, 16 Drawing Sheets

SCALABLE SERIALIZER-DESERIALIZER ARCHITECTURE AND PROGRAMMABLE INTERFACE

TECHNICAL FIELD

The present invention relates generally to electrical circuits and, more particularly, to interface circuits for programmable devices.

BACKGROUND

There has been a growing proliferation of high-speed input/output interface standards directed toward various applications within the electronics industry. These standards generally address chip-to-chip interfaces, board-to-board interfaces, and box-to-box interfaces for a wide range of emerging applications, such as data packet processing, data bus bridges, and high-speed memory interfacing, to name but a few.

Certain programmable devices, such as field programmable gate arrays (FPGAs) and complex programmable logic devices (CPLDs), can potentially handle a wide range of input/output interface standards because of their flexible programmable circuitry. A drawback of some programmable devices is that their input/output circuits are often dedicated to only one or to a few certain types of input/output interface standards. Consequently, if these input/output interface standards are not being provided to the programmable device, there is a corresponding loss of input/output functionality or bandwidth and a number of input/output pins may not be utilized. As a result, there is a need for programmable interface circuits that may be programmed to support a number of different types of input/output interface standards.

SUMMARY

Systems and methods are disclosed herein to provide, in accordance with one or more embodiments of the present invention, a programmable interface for a programmable device. For example, in accordance with one embodiment, a programmable interface selectively enables a scalable serializer-deserializer architecture with clock and data recovery functionality as part of programmable input/output circuitry to support a number of input/output interface standards. The programmable interface may further include or be supported by one or more embedded memory blocks.

More specifically, in accordance with one embodiment of the present invention, a programmable logic device includes input/output buffers adapted to programmably support a plurality of signal types; a serializer deserializer circuit adapted to receive a serial input data stream and extract a clock and provide a parallel data output signal and further adapted to receive a parallel data input signal and provide a serial output data stream; and a programmable interconnect adapted to selectively couple the input/output buffers to the serializer deserializer circuit.

In accordance with another embodiment of the present invention, a method of providing a programmable interface for a programmable logic device includes providing buffers adapted to programmably transfer a number of different signal types to and from the programmable logic device; and providing a programmable interconnect to selectively couple or decouple an interface circuit, having serializer, deserializer, and clock and data recovery capability, to the buffers depending upon the signal type.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Figure 1:
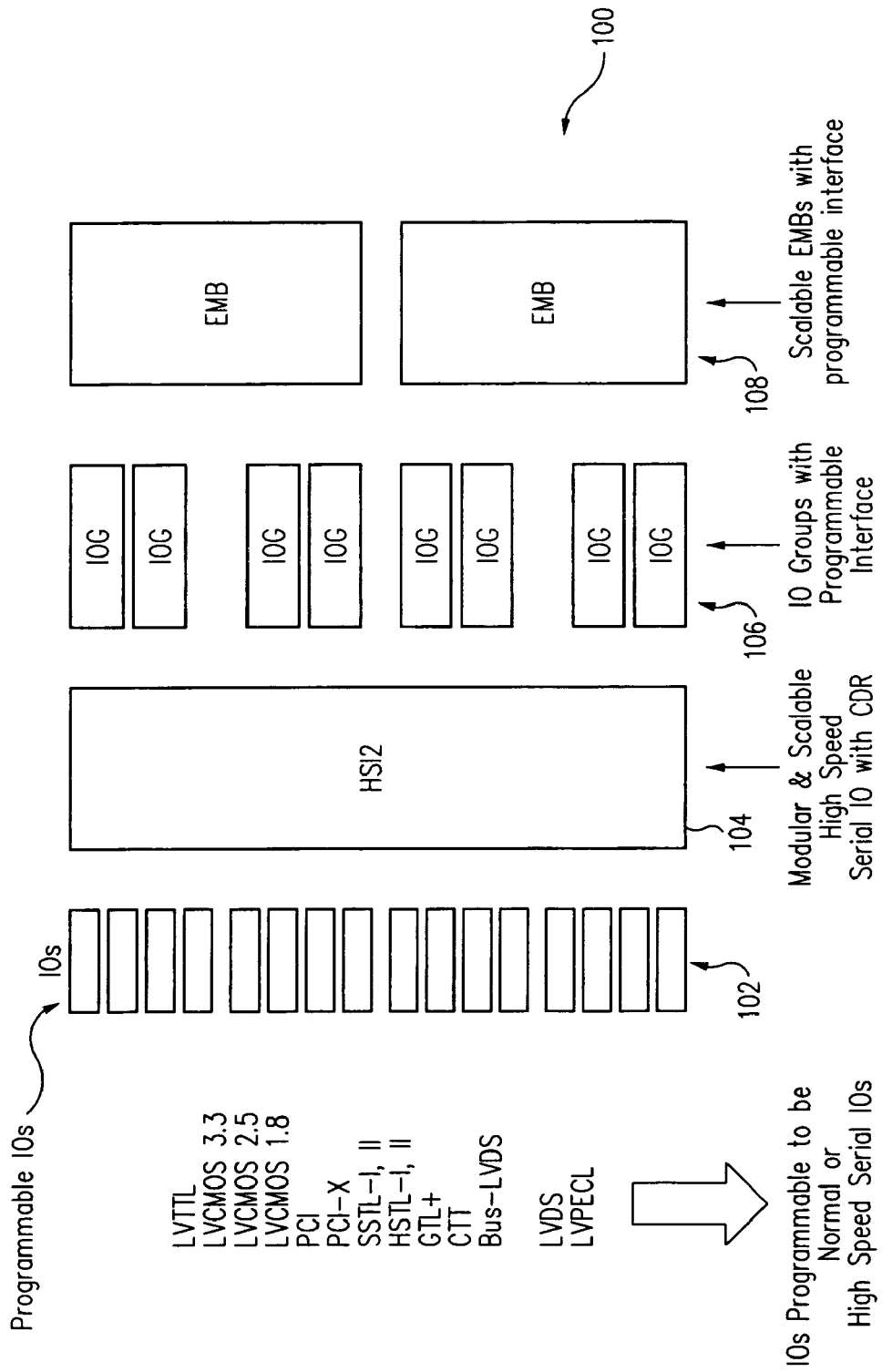
FIG. 1 shows a block diagram illustrating a programmable interface in accordance with an embodiment of the present invention.

FIG. 1 shows a block diagram illustrating a programmable interface 100 for a programmable logic device in accordance with an embodiment of the present invention. Programmable interface 100 includes programmable input/output buffers 102, a high-speed interface circuit 104, programmable input/output groups 106, and memory 108.

Input/output buffers 102 are programmable to support various signaling types, such as the exemplary list of signal types shown in FIG. 1. For example, input/output buffers 102 may be designed to support normal speed input/output signals (e.g., single ended signals such as LVTTL) and also high-speed differential signals (e.g., LVDS). Interface circuit 104 provides selectable serializer and deserializer functionality along with clock and data recovery capability.

Input/output groups 106 provide a programmable interconnect for selectively interconnecting interface circuit 104 with input/output buffers 102, memory 108, and/or logic blocks (not shown). For example, for input/output interface standards that require the capabilities of interface circuit 104, input/output groups 106 may be programmed to interconnect or route signals between input/output buffers 102 and interface circuit 104. Input/output groups 106 may further interconnect or route signals between interface circuit 104 and memory 108 or directly to logic blocks (not shown). Alternatively, for input/output interface standards that do not require the capabilities of interface circuit 104, input/output groups 106 may route signals between input/output buffers 102 and memory 108 and/or the logic blocks and bypass interface circuit 104.

The logic blocks may be look-up table based logic devices or logic gate based logic devices (e.g., a programmable AND array) or other types of known logic blocks implemented in a programmable logic device. Memory 108 is embedded within the programmable logic device and may be utilized to assist various functions of programmable interface 100. For example, memory 108 may be aligned with input/output groups 106 and interface circuit 104 to provide corresponding synchronizing functions.

Programmable interface 100, which is incorporated into a programmable logic device (e.g., FPGA, CPLD, or programmable interconnect device), provides a high-speed serializer/deserializer and CDR functionality along with a programmable interface or interconnect and programmable input/output buffers or circuits. Programmable interface 100 is scalable for a wide range of sizes within a device family and is capable of supporting a large number of high speed differential channels, such as for example for high-speed communication systems employed with high-speed backplanes or chip-to-chip applications.

Input/output buffers 102 and input/output groups 106 are programmable to allow for various types of input/output standards or input/output signaling levels to be supported. For example, the same input/output pins and input/output buffers 102 that are configured to support high-speed serializer/deserializer signals may also be configured to support other types of signals. Consequently, input/output pins are not dedicated to only supporting differential signals (e.g., LVDS), but may be made available to support various other types of signals (e.g., single-ended signals), which results in an increase in input/output functionality and input/output bandwidth. Input/output buffers 102 may be implemented, for example, as shown and described in U.S. Pat. No. 6,480,026 entitled "Multi-functional I/O Buffers in a Field Programmable Gate Array" issued Nov. 12, 2002, which is herein incorporated by reference in its entirety.

Programmable interface 100 may be configured in a modular and scalable manner to support a wide range of device sizes within a device family. For example, as shown in FIG. 1, each interface circuit 104 may be configured to programmably interconnect with eight input/output groups 106 and sixteen input/output buffers 102. This scalable or modular structure may be replicated to support the desired device size or desired input/output capability.

Figure 2:
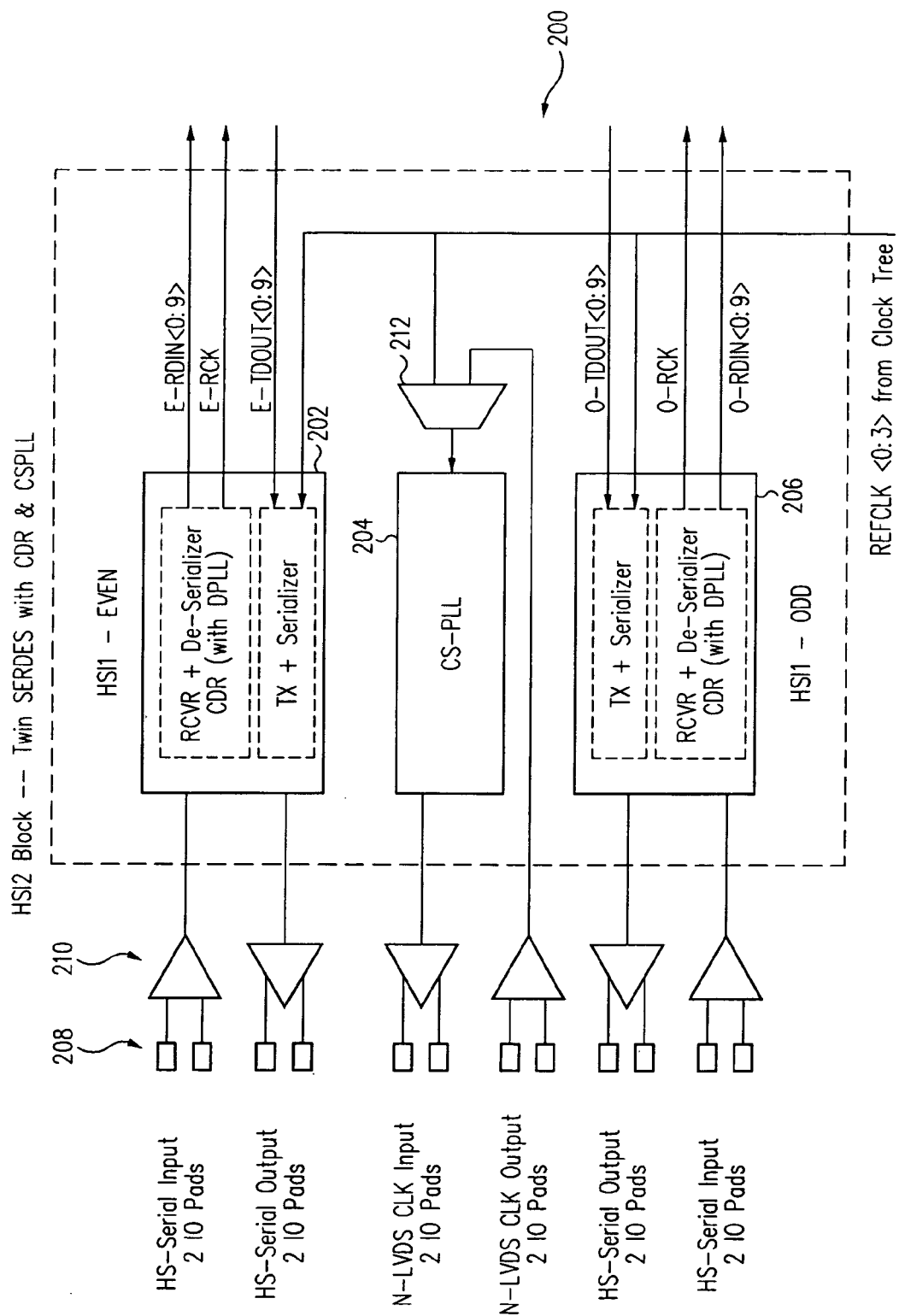
FIG. 2 shows a block diagram illustrating exemplary details for a portion of FIG. 1 in accordance with an embodiment of the present invention.

FIG. 2 shows a block diagram illustrating an interface circuit 200 in accordance with an embodiment of the present invention. Interface circuit 200 is an exemplary implementation of interface circuit 104 (FIG. 1) and includes serializer/deserializer (SERDES) 202 and 206 and a phase-locked loop (PLL) 204. Pads 208 are input/output pads for a programmable device that incorporates interface circuit 200. Buffers 210 are input/output buffers and may represent in an exemplary fashion one of the functions of input/output buffers 102 (FIG. 1).

PLL 204 is a PLL clock synthesizer (e.g., an analog PLL) that multiplies either a reference clock (an internal clock from one of the clock trees and labeled REFCLK) or a clock (labeled N-LVDS CLK) received via corresponding pads 208, which is determined by a multiplexer 212, to generate one or more high speed clocks for SERDES 202 and 206. SERDES 202 and 206 may each be utilized as a full duplex channel (one receiver channel and one transmitter channel) or as one SERDES with CDR. SERDES 202 and 206 each include a transmitter (TX), which includes a serializer, along with a receiver (RCVR), which includes a deserializer and CDR capability.

The transmitter and serializer serializes low speed parallel input data (e.g., labeled TDOUT<0:9> and clocked into the transmitter with the reference clock) from core logic into a high speed serial data stream operating at the high speed clock rate (supplied by PLL 204) and transmits the serial data stream via corresponding buffers 210 and pads 208. The receiver and deserializer receives a high speed input serial data stream from corresponding buffers 210 and pads 208 and deserializes the recovered high speed serial data into a low speed parallel output data (e.g., labeled RDIN<0:9>) that is provided for the core logic.

The receiver in CDR mode may employ its own digital PLL to extract the high speed clock and the high speed serial data from the high speed input serial data stream. The receiver may also divide the recovered high speed clock to produce a low speed clock (labeled RCK) for the parallel output data.

Depending upon the application, only one transmitter or one receiver with or without CDR may be employed or any combination of receivers and transmitters may be employed (along with PLL 204 to provide the high speed clocks). As an example of operation, SERDES 202 or 206 may support 2 Gbit bidirectional data bandwidth or two separate 1 Gbit unidirectional data bandwidth. Consequently for this example, N channels can support N*2 Gbit bidirectional data bandwidth.

Further details regarding implementation of interface circuits and SERDES circuits with CDR may be found for example in U.S. patent application No. 10/023,226 entitled "High Speed Interface for a Programmable Interconnect Circuit" filed Dec. 14, 2001, which is herein incorporated by reference in its entirety. Additional details regarding implementation of interface circuits and CDR and PLL circuitry may be found for example in U.S. patent application Ser. No. 10/006,516 entitled "Digital Phase Locked Loop with Programmable Digital Filter" filed Dec. 3, 2001, which is herein incorporated by reference in its entirety.

By utilizing interface circuits 200 and programmable input/output capability within a programmable device, a large number of high-speed serial input/output channels, which may require CDR functions, may be supported. For example, input/output signals or standards that may be supported and may require SERDES and CDR capability may include Gigabit Ethernet, SONET OC-12, SONET OC-3, IEEE Standard 1394, Fibre Channel, HDTV, SDTV, Fast Ethernet, SERDES without encoding/decoding (8B/10B), SERDES with encoding/decoding (10B/12B), and source-synchronous (n-channels). Additionally, input/output signals or standards that may require high-speed serial input/output with CDR may be supported, such as for example XAUI, Infiniband, SONET/SDH, 2X Fibre Channel, Fibre Channel, and Gbit Ethernet.

A clock rate for the core logic of the programmable logic device will determine for some applications whether interface circuit 104 is required. For example, if the programmable logic device's core logic is operating at a fast enough rate to receive one type of input/output interface standard (e.g., 3 to 400 Mbps), then input/output groups 106 may be programmed to bypass interface circuit 104. However, if the programmable logic device also receives another type of input/output interface standard (e.g., 622 Mbps to 1.25 Gbps) having a data rate faster than the programmable logic device's core logic capability, then input/output groups 106 may be programmed to employ interface circuit 104.

Figure 3:
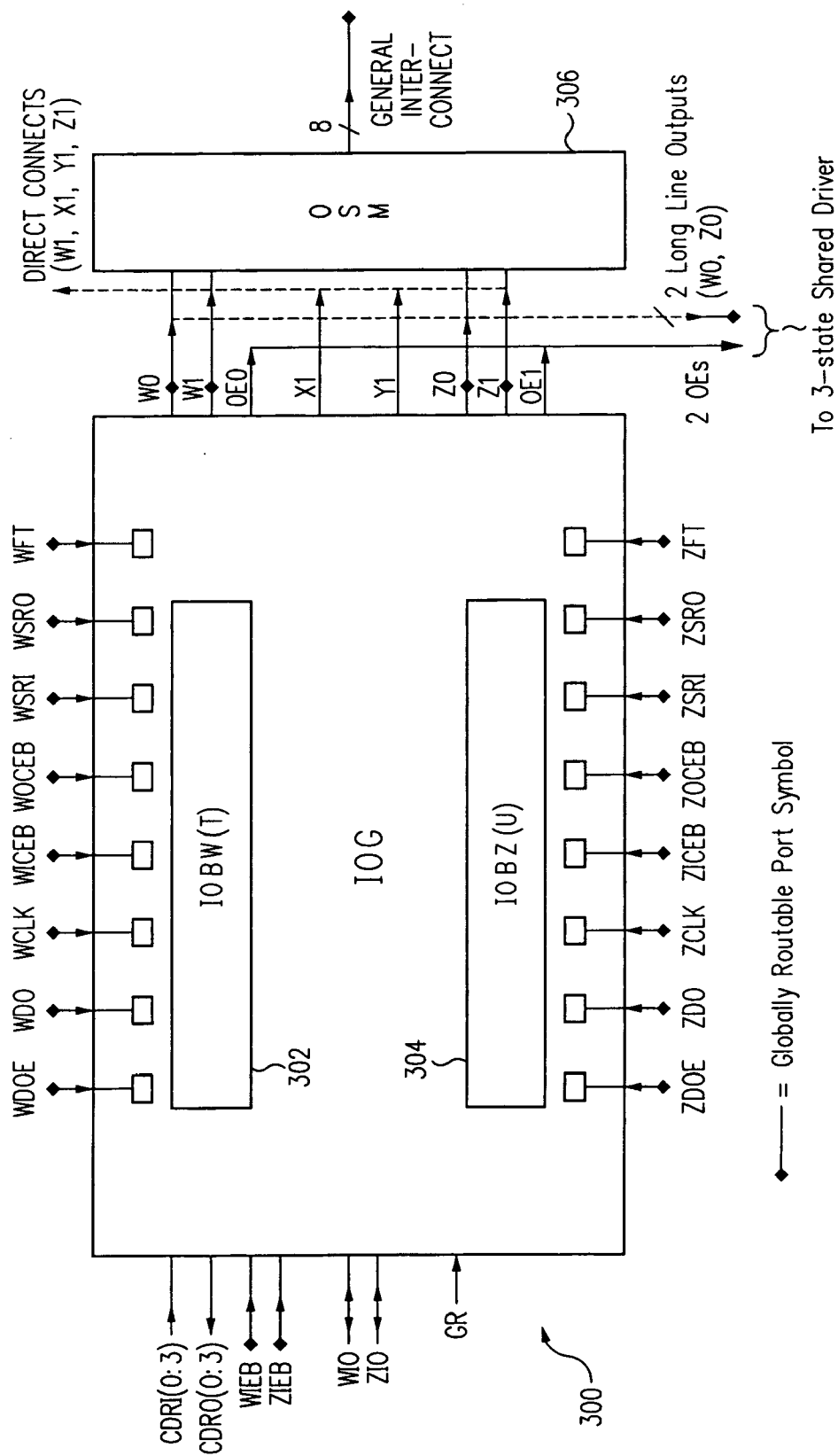
FIG. 3 shows a block diagram illustrating exemplary details for another portion of FIG. 1 in accordance with an embodiment of the present invention.

FIG. 3 shows a block diagram illustrating an input/output group 300 in accordance with an embodiment of the present invention. Input/output group 300 is an exemplary implementation of one of the eight input/output groups 106 (FIG. 1, where each input/output group 106 is labeled IOG). Input/output group 300 includes input/output blocks 302 and 304 and an output switch matrix (OSM) 306, which may be part of input/output group 300 or associated with input/output group 300.

Input/output group 300 has eighteen globally routable ports (identified at the top (WDOE through WFT) and bottom (ZDOE through ZFT) and left side (WIEB and ZIEB) by the globally routable port symbol identified in FIG. 3) and four globally routable output ports (W0, W1, Z0, and Z1). Input/output ports WIO and ZIO along with a global reset (GR) port are not globally routable signal paths (i.e., they do not route via the input multiplexer), but rather are paths for input/output pads and a reset signal, respectively. OSM 306 has eight output ports (general interconnects) for routing input signals.

Figure 4:
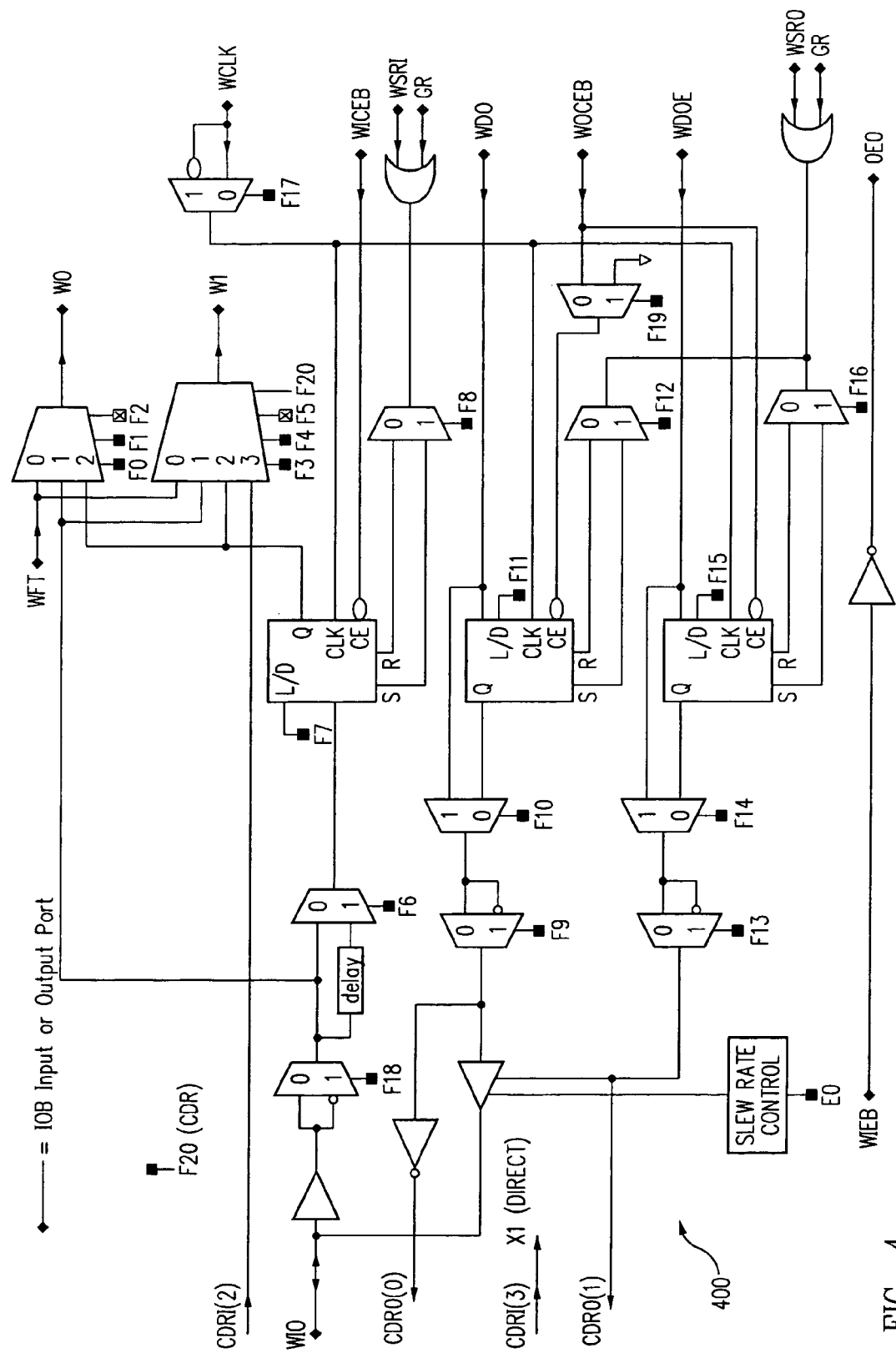
FIG. 4 shows a block diagram illustrating exemplary details for a portion of FIG. 3 in accordance with an embodiment of the present invention.
Figure 5:
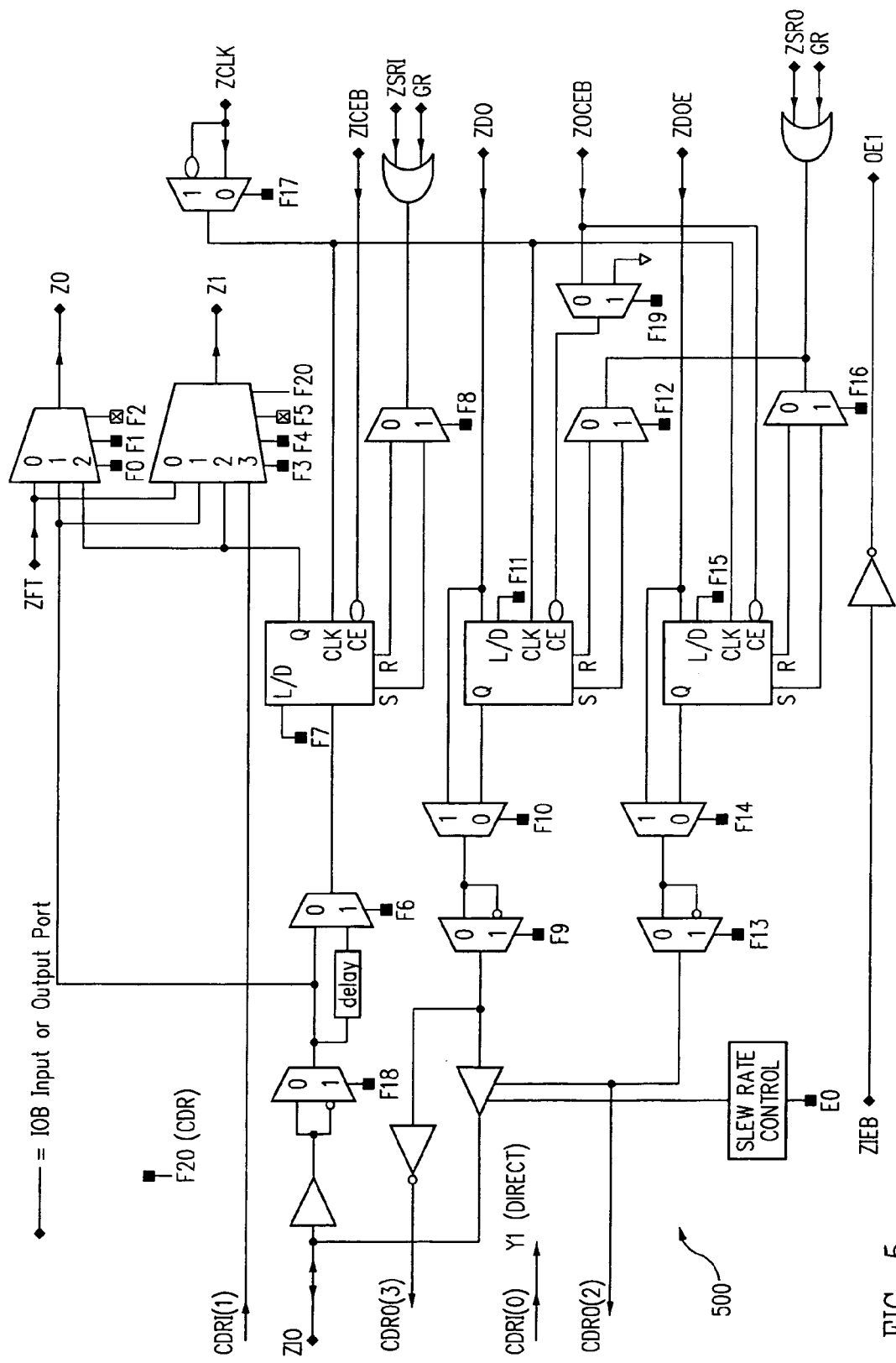
FIG. 5 shows a block diagram illustrating exemplary details for another portion of FIG. 3 in accordance with an embodiment of the present invention.

As an implementation example, FIGS. 4 and 5 show an input/output block 400 and an input/output block 500, respectively, in accordance with an embodiment of the present invention. Specifically, input/output block 400 is an exemplary circuit implementation for input/output block 302 (FIG. 3), while input/output block 500 is an exemplary circuit implementation for input/output block 304 (FIG. 3).

Figure 6:
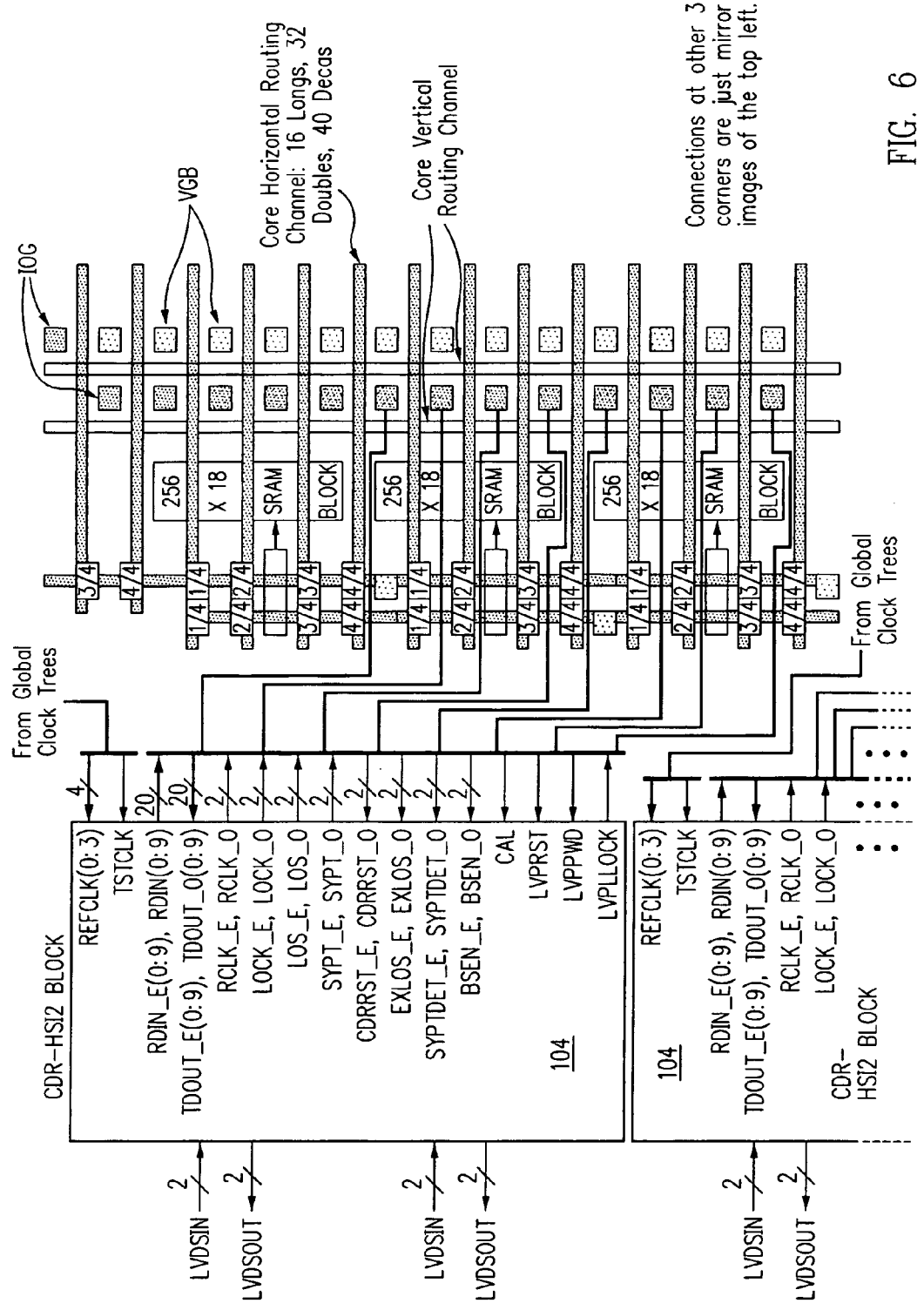
FIG. 6 shows a block diagram illustrating exemplary connections between blocks for a portion of FIG. 1 in accordance with an embodiment of the present invention.

As another implementation example, FIG. 6 shows a block diagram illustrating exemplary connections between blocks for a portion of FIG. 1 in accordance with an embodiment of the present invention. Specifically, FIG. 6 shows exemplary signal routing and interconnect structure between interface circuit 104 and a portion of another interface circuit 104 and input/output groups 106 (labeled IOG), memory 108 (e.g., static random access memory (SRAM) blocks), and logic blocks (labeled VGB). Various exemplary signals, besides those discussed above, are listed within interface circuit 104, which represent exemplary control signals for managing interface circuit 104 and its interfaces.

Figure 7:
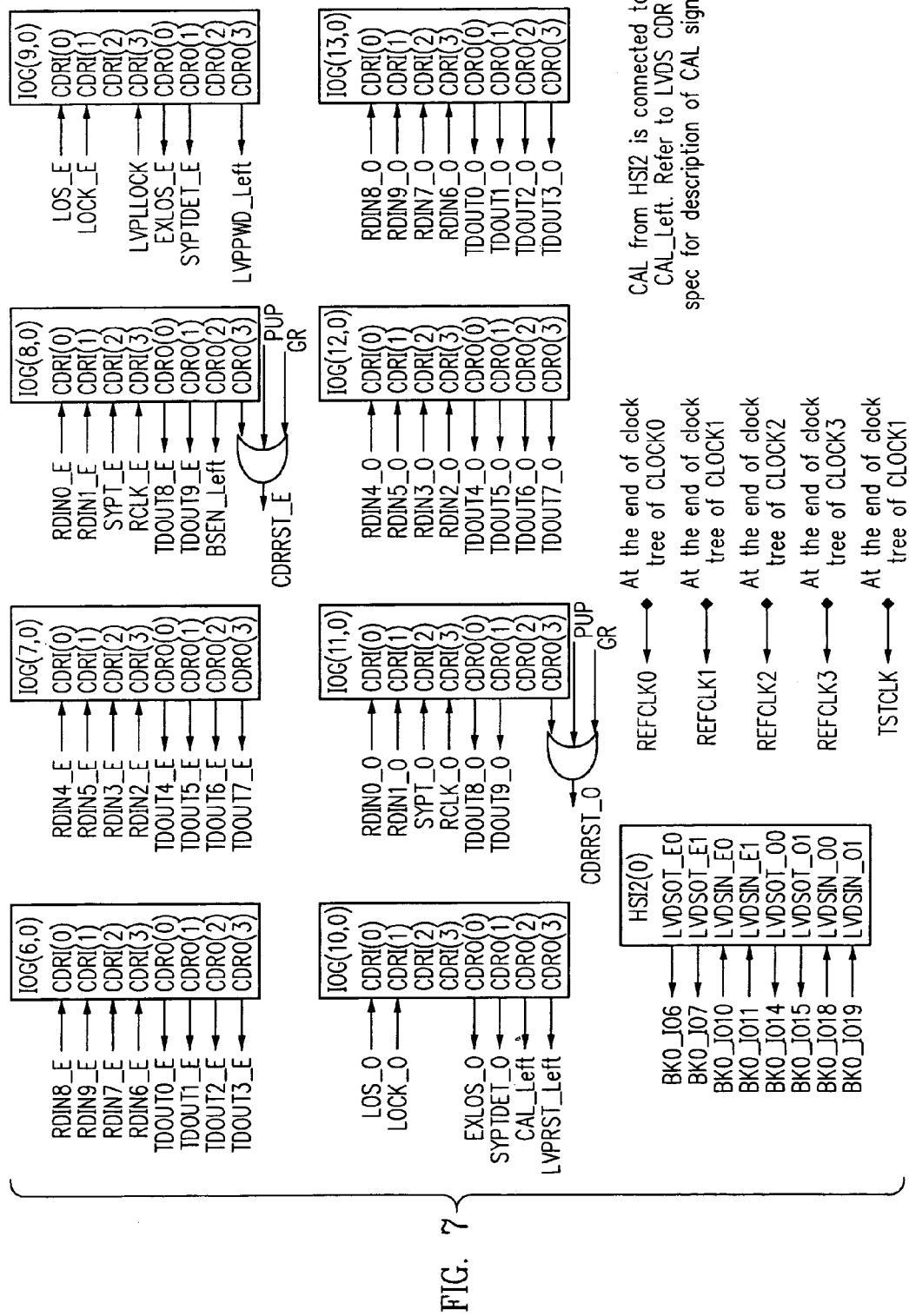
FIG. 7 shows a block diagram illustrating exemplary connections between blocks for a portion of FIG. 1 in accordance with an embodiment of the present invention.
Figure 8:
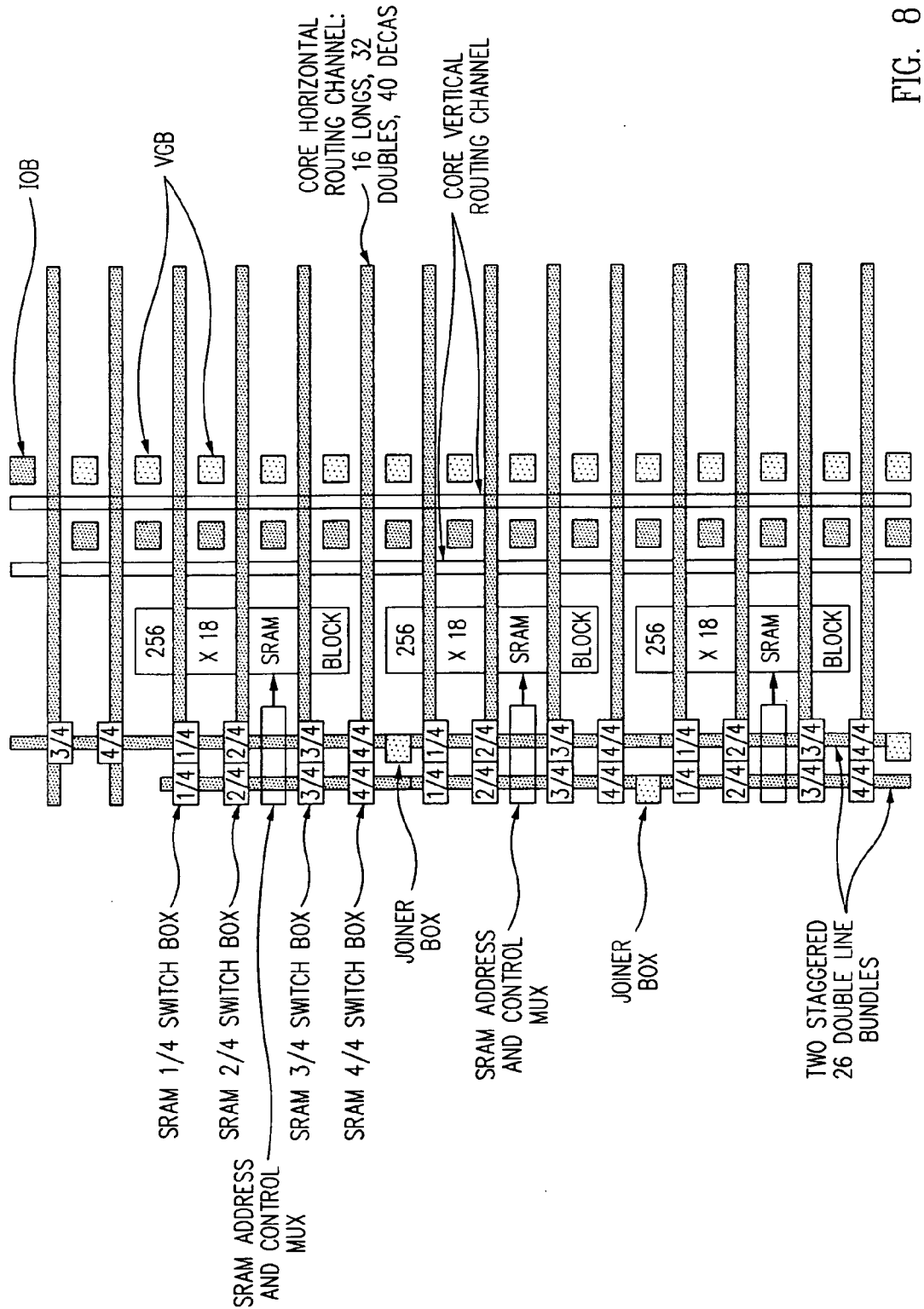
FIG. 8 shows a block diagram illustrating exemplary routing for memory shown in FIG. 1 in accordance with an embodiment of the present invention.

Similarly, FIG. 7 shows a block diagram illustrating exemplary connections between interface circuit 104 and input/output groups 106 in accordance with an embodiment of the present invention. Additionally, FIG. 8 shows a block diagram illustrating exemplary routing and control details for memory 108 shown in FIG. 1 in accordance with an embodiment of the present invention. In this example, memory 108 is represented by dual-port SRAM, with FIG. 8 illustrating address, control, and interconnect resources for three 256 by 18 SRAM blocks in relation to input/output groups 106 (or input/output blocks 302 and 304) and the logic blocks (VGB).

Figure 9:
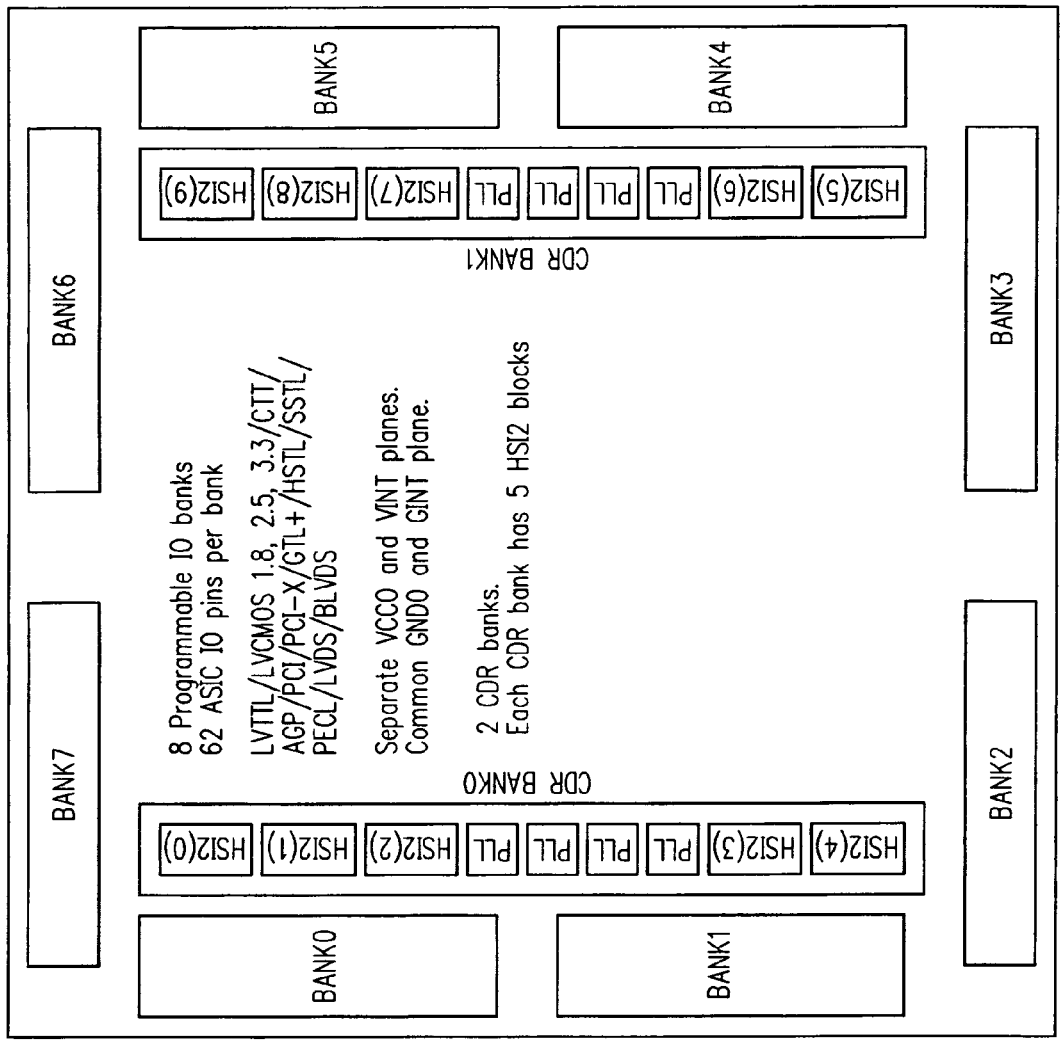
FIG. 9 shows a block diagram illustrating exemplary interface banks for a programmable logic device in accordance with an embodiment of the present invention.

FIG. 9 shows a block diagram illustrating an exemplary bank layout 900 for a programmable logic device in accordance with an embodiment of the present invention. Bank layout 900 includes eight programmable input/output banks (labeled Bank0 through Bank7) and two additional banks (labeled CDR Bank0 and CDR Bank1). The programmable input/output banks may include or represent input/output buffers 102 (as discussed in reference to FIG. 1). The two additional banks may each include a number of interface circuits 104 (as discussed in reference to FIG. 1). For example, the two additional banks may each include five of interface circuits 104 along with four additional PLL circuits.

Figure 10:
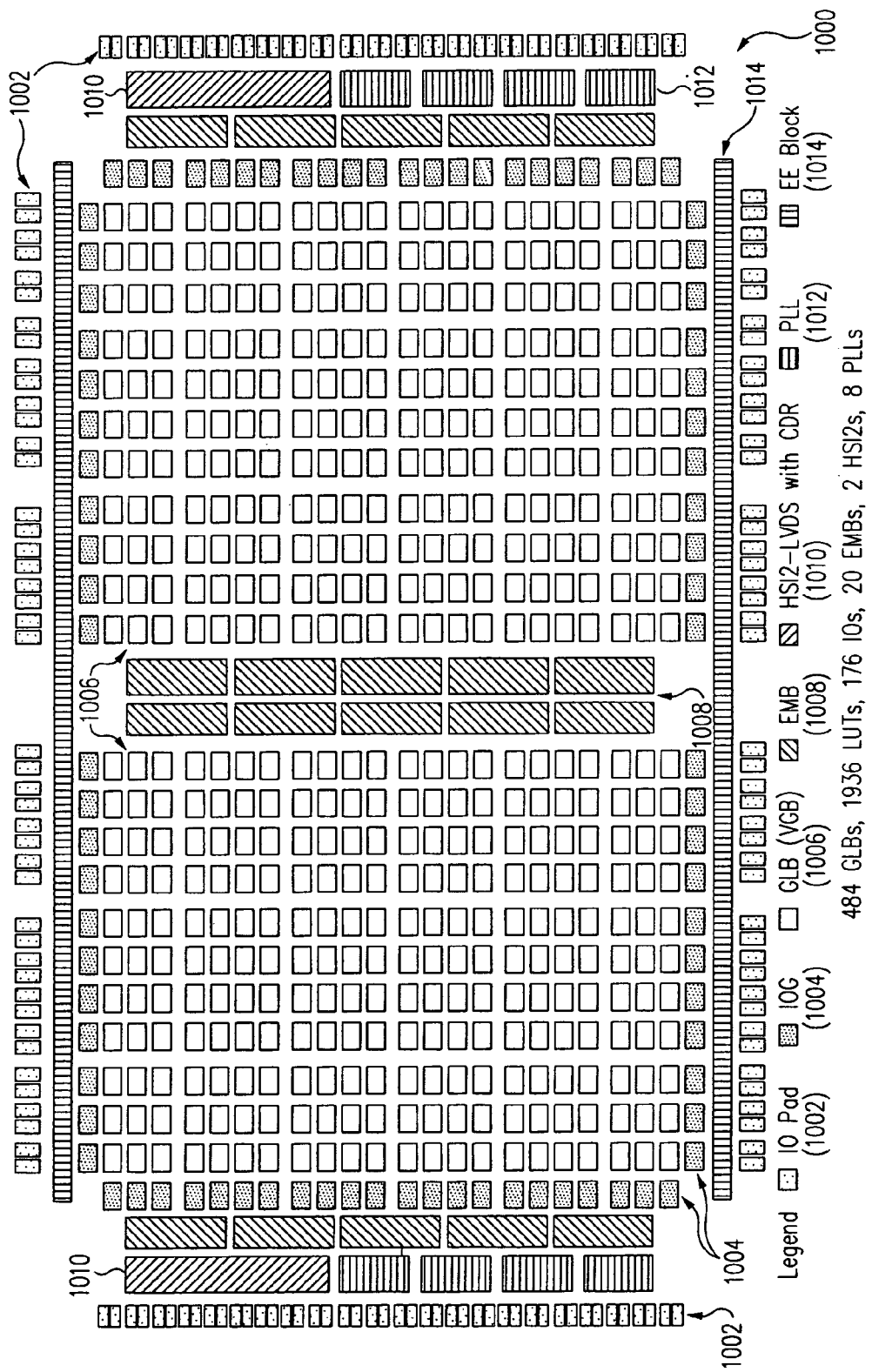
FIG. 10 shows a block diagram illustrating a programmable logic device having a programmable interface in accordance with an embodiment of the present invention.

FIG. 10 shows a block diagram illustrating a programmable logic device (PLD) 1000 having a programmable interface in accordance with an embodiment of the present invention. PLD 1000 is an exemplary implementation of techniques discussed herein for providing a programmable interface. PLD 1000 includes input/output (IO) pads 1002, input/output groups (IOG) 1004, logic blocks (GLB) 1006, memory (EMB) 1008, interface circuits (HSI2) 1010, PLLs 1012, and EE blocks 1014.

Input/output pads 1002 provide the input/output buffering and correspond to input/output buffers 102 (FIG. 1). Input/output groups 1004 correspond to input/output groups 106 (FIG. 1). Logic blocks 1006 may represent generic logic devices, such as would typically be found in an FPGA or a CPLD. For this specific example, logic blocks 1006 include lookup tables (LUTs) to assist in performing various logic functions. Memory 1008 corresponds to memory 108 (FIG. 1), while each interface circuit 1010 corresponds to interface circuit 104 (FIG. 1). PLL 1012 represent PLL devices that are employed for various functions, while EE blocks 1014 represent additional on-chip memory (e.g., electrically erasable memory).

Figure 11:
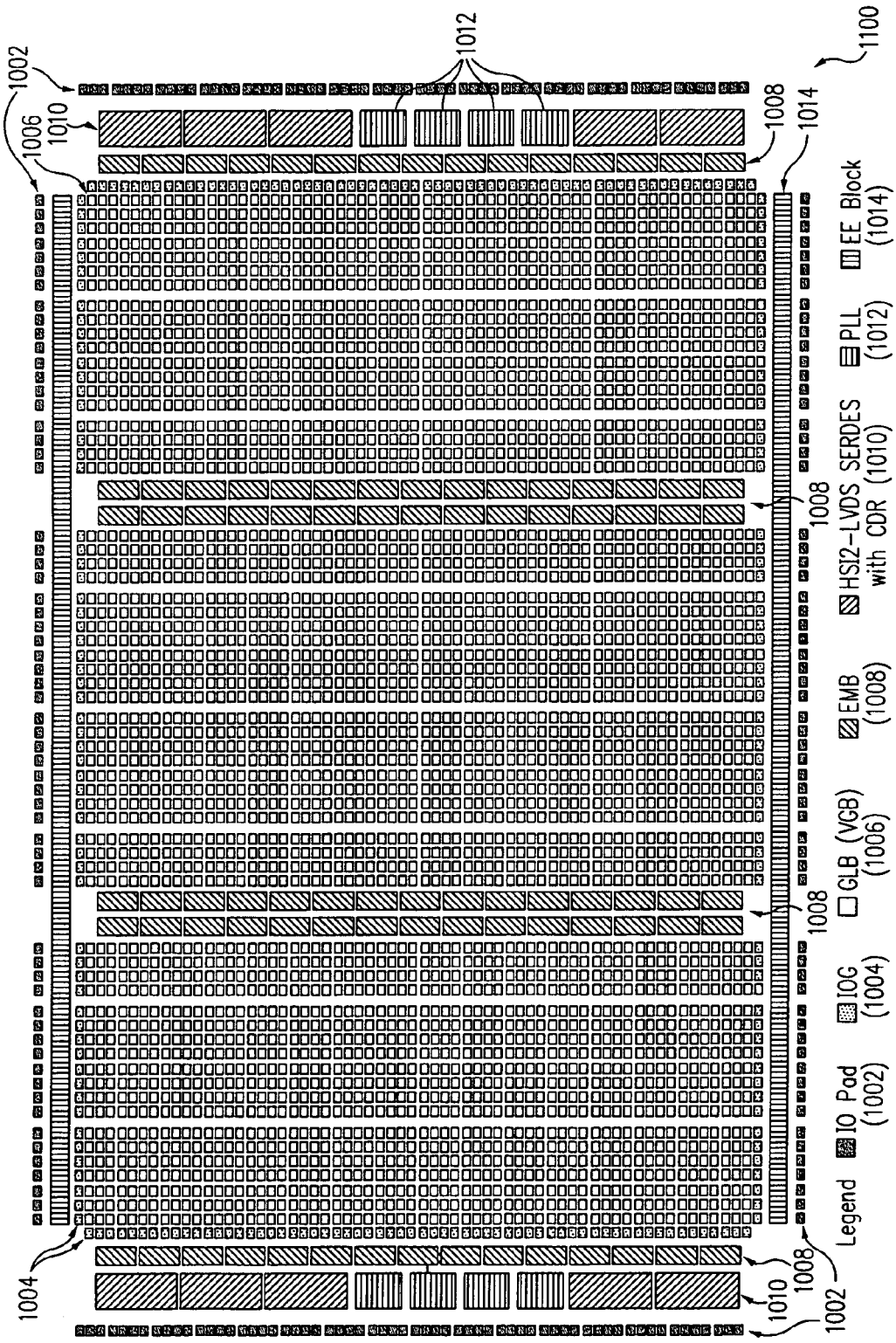
FIG. 11 shows a block diagram illustrating another programmable logic device having a programmable interface in accordance with an embodiment of the present invention.

The techniques discussed herein for a programmable interface may be scaled to any size of programmable device. For example, FIG. 10 illustrates a programmable logic device that incorporates two interface circuits 1010. As another example, FIG. 11 illustrates a larger programmable logic device, in accordance with an embodiment of the present invention, which incorporates ten interface circuits 1010. The number of programmable input/output pads 1002, input/output groups 1004, and memory 1008 may also be scaled appropriately for the desired application.

Figure 12:
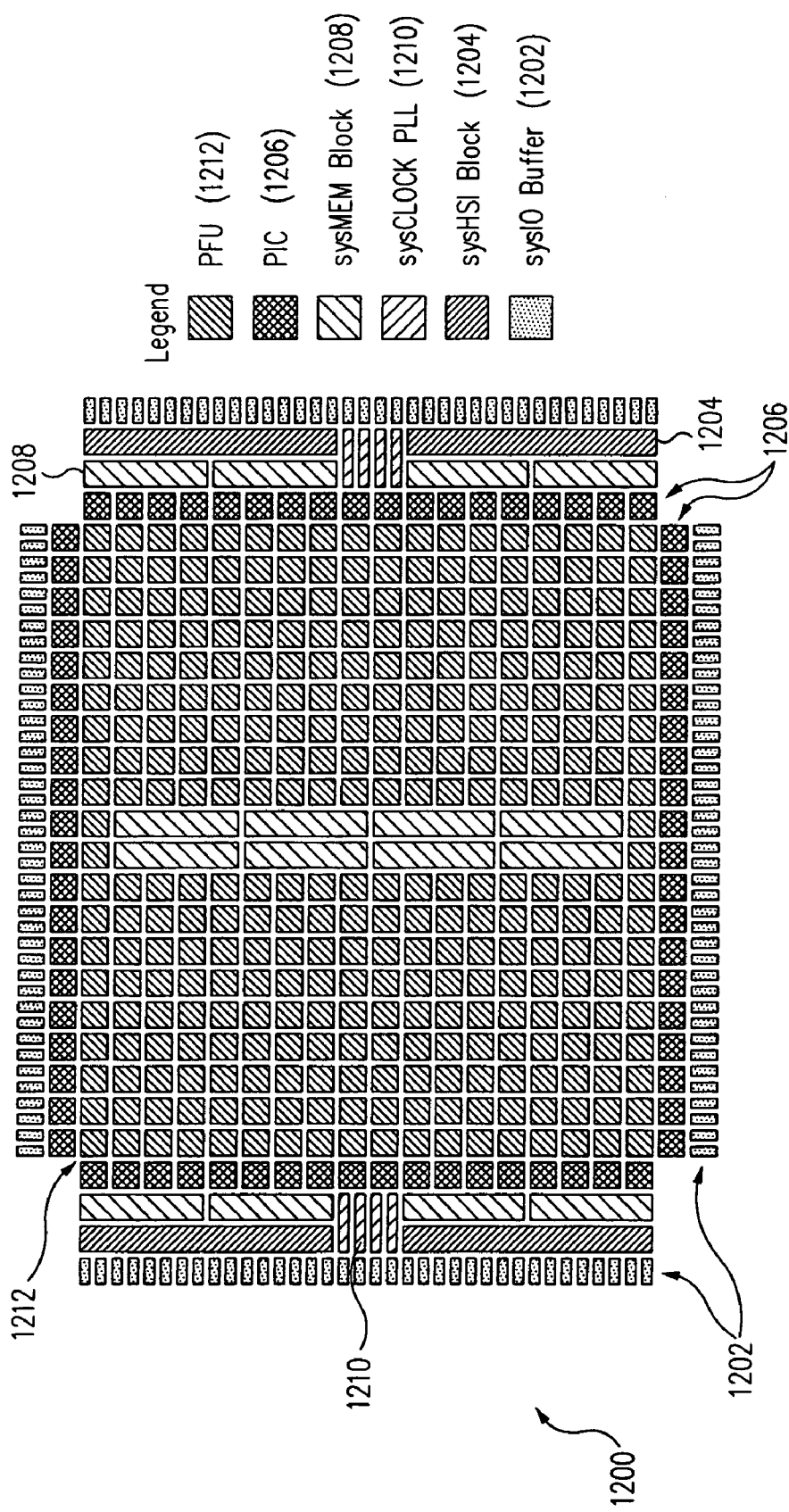
FIG. 12 shows a block diagram illustrating a programmable logic device having a programmable interface in accordance with an embodiment of the present invention.

As a more specific implementation example, FIG. 12 shows a block diagram illustrating a programmable logic device (PLD) 1200 having a programmable interface in accordance with an embodiment of the present invention. Specifically, PLD 1200 includes input/output buffers (labeled sysIO Buffers) 1202, interface circuits (labeled sysHSI Blocks) 1204, input/output groups (labeled PIC) 1206, memory (labeled sysMEM Blocks) 1208, PLLs (labeled sysCLOCK PLL) 1210, and logic blocks (labeled PFU) 1212.

Input/output buffers 1202, interface circuits 1204, input/output groups 1206, and memory 1208 may represent exemplary implementations for input/output buffers 102, interface circuits 104, input/output groups 106, and memory 108, respectively, of FIG. 1. PLLs 1210 provide clock and PLL functions for PLD 1200, such as for example to synthesize clock frequencies and generate clock signals. Logic blocks 1212 employ lookup tables and other associated logic circuitry to implement logic, memory, arithmetic, and register functions.

Each input/output group 1206 may be associated with two input/output buffers 1202, with each input/output buffer 1202 having one input and one output buffer, which are configurable for various input/output interface standards. Input/output groups 1206 interface logic blocks 1212 and memory 1208 to input/output buffers 1202 and interface circuits 1204. Memory 1208 can be configured as RAM, ROM, FIFO, or other types of storage, including single and dual-port memory.

Figure 13:
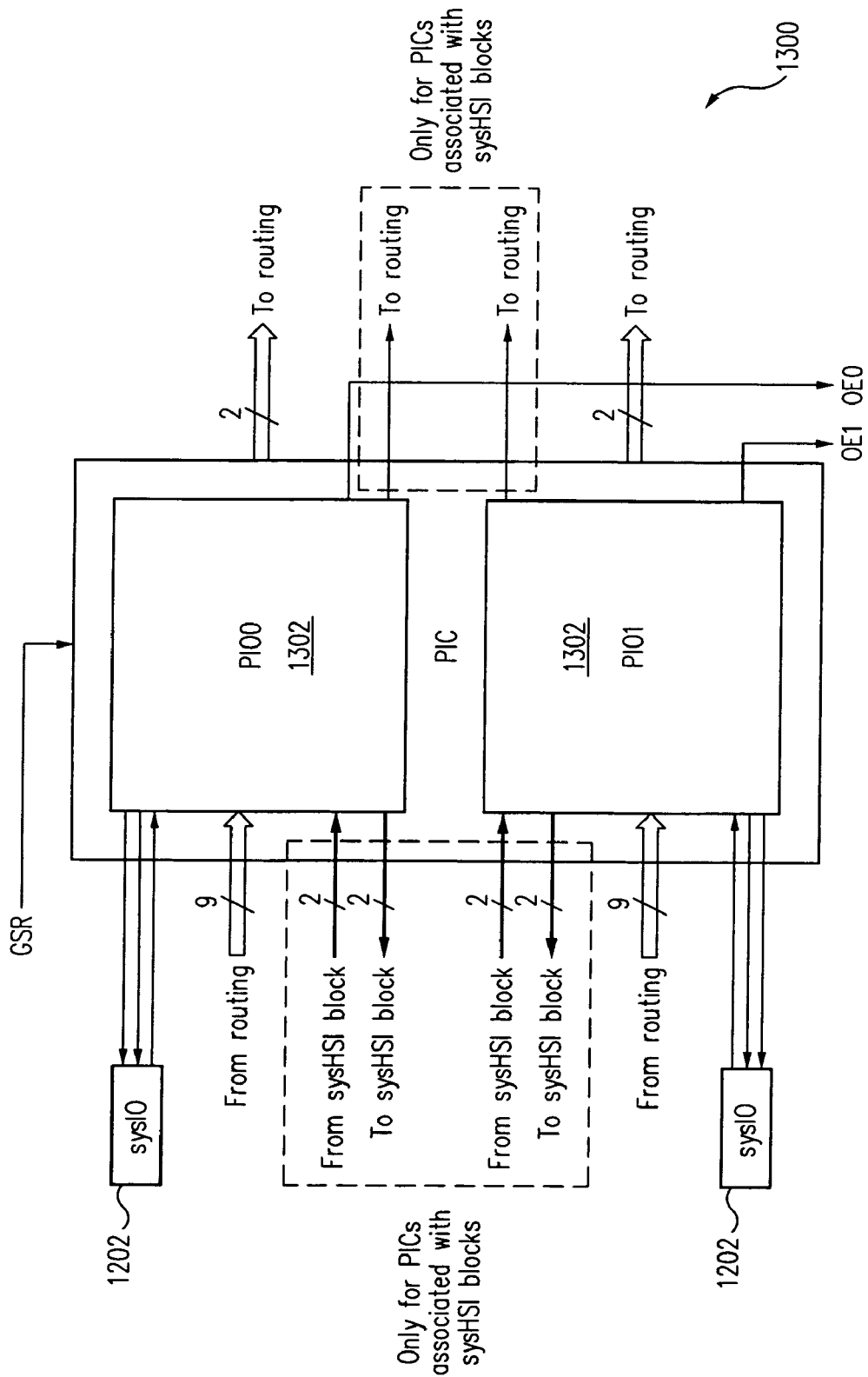
FIG. 13 shows a block diagram illustrating exemplary details for a portion of FIG. 12 in accordance with an embodiment of the present invention.
Figure 14:
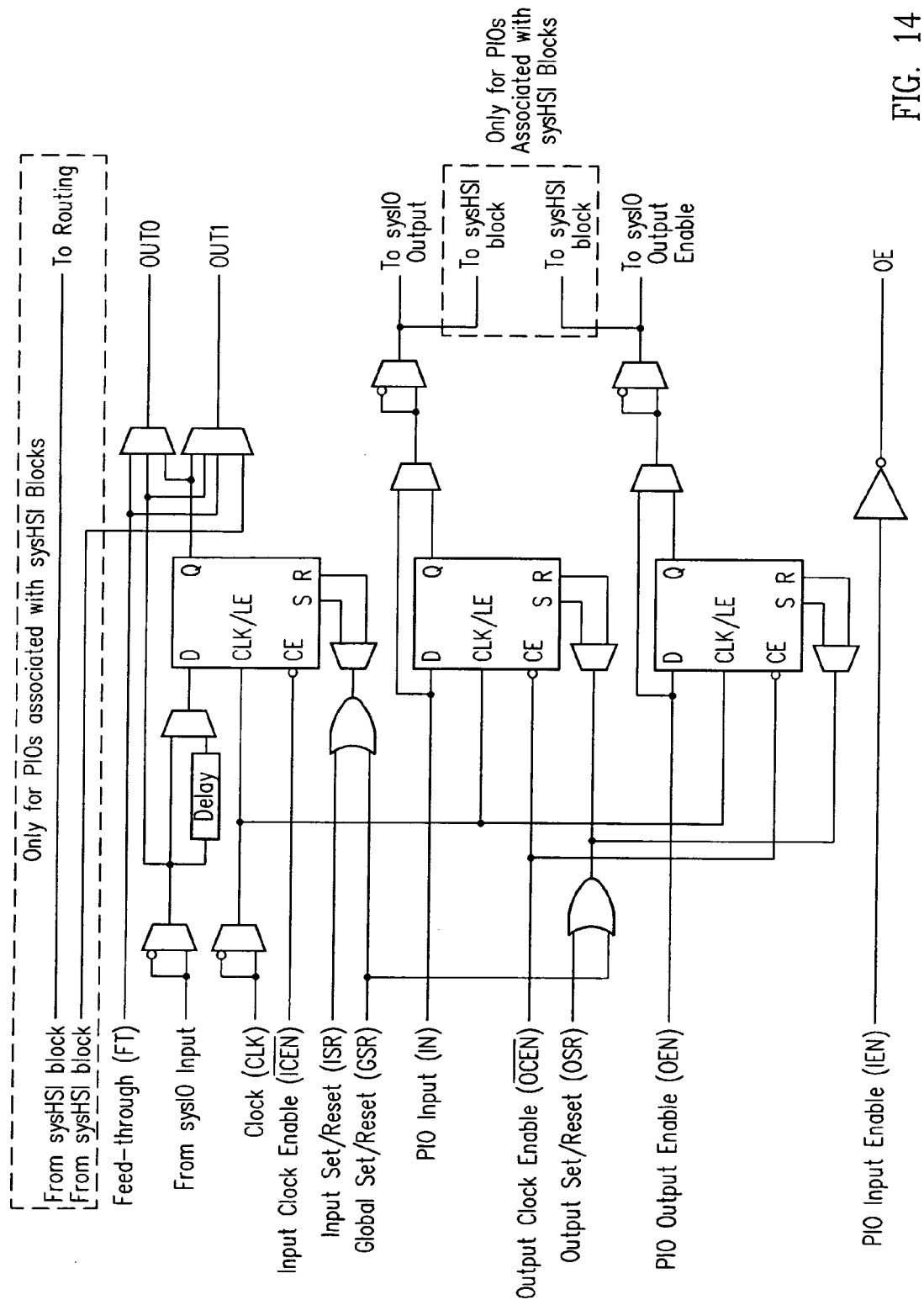
FIG. 14 shows a block diagram illustrating exemplary details for a portion of FIG. 13 in accordance with an embodiment of the present invention.

FIG. 13 shows an exemplary circuit implementation 1300 for one input/output group 1206 (one PIC block in FIG. 12) in accordance with an embodiment of the present invention. Circuit 1300 includes two programmable input/output sections 1302, which are labeled PIO0 and PIO1. FIG. 14 shows an exemplary circuit implementation for one programmable input/output section 1302 in accordance with an embodiment of the present invention.

Figure 15:
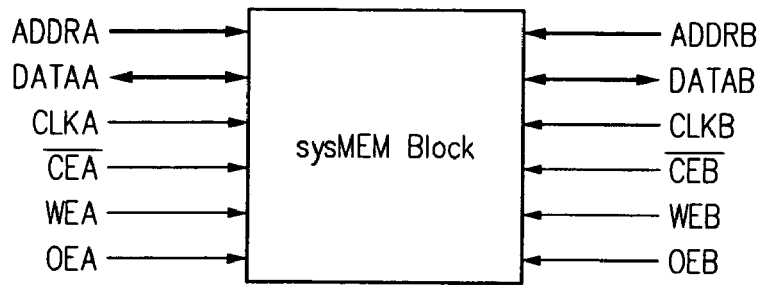
FIG. 15 shows a block diagram illustrating exemplary details for another portion of FIG. 12 in accordance with an embodiment of the present invention.
Figure 16:
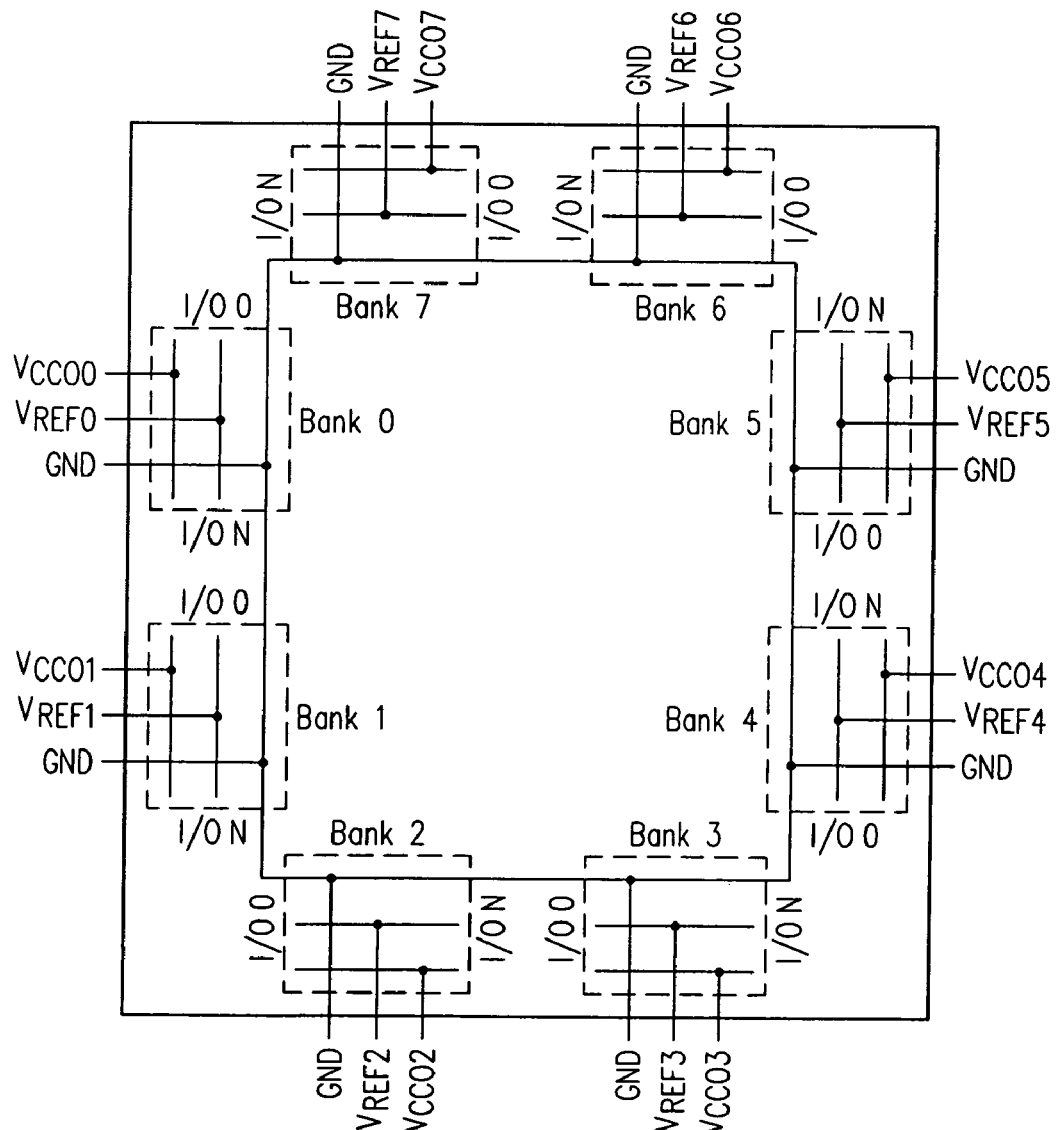
FIG. 16 shows a block diagram illustrating exemplary interface banks for a programmable logic device in accordance with an embodiment of the present invention.

FIG. 15 shows a block diagram illustrating exemplary details for one memory 1208 (one sysMEM Block in FIG. 12) in accordance with an embodiment of the present invention. Each block of memory 1208 can operate, for example, as single-port or dual-port RAM. FIG. 16 shows a block diagram illustrating exemplary interface banks for the programmable logic device of FIG. 12 in accordance with an embodiment of the present invention. The interface banks each include a number of input/output buffers 1202.

As an example, eight interface banks are shown (i.e., Bank 0 through Bank7), with each capable of supporting multiple input/output interface standards. Each of the banks has its own supply voltage (Vcco) and reference voltage resources (Vref) that allow each of the banks to operate individually and be independently configurable relative to the other banks. Consequently, each of the banks can support unterminated single-ended interfaces (e.g., LVTTL), terminated single-ended interfaces (e.g., SSTL and HSTL), and differential interfaces (e.g., LVDS, BLVDS, and LVPECL).

Figure 17:
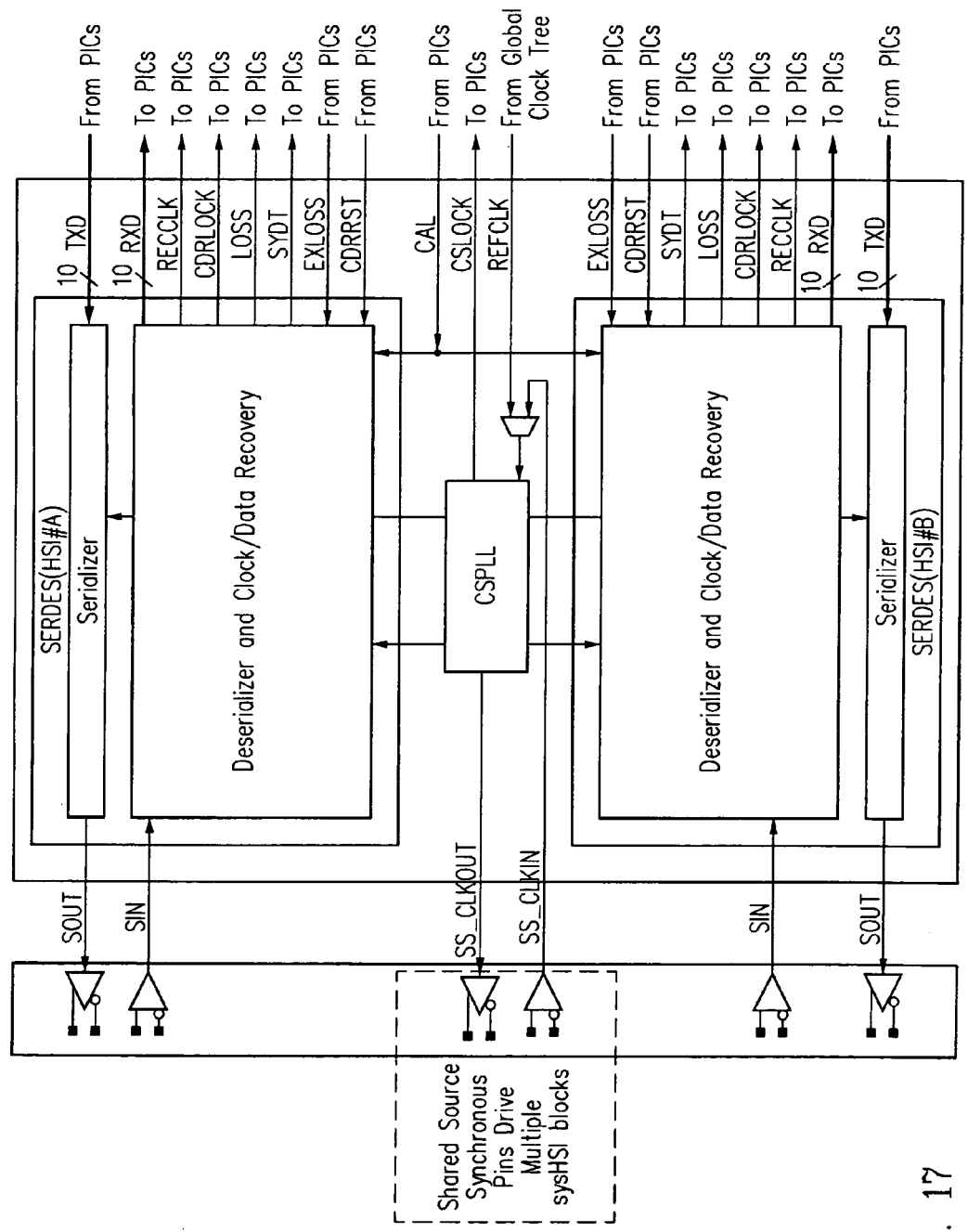
FIG. 17 shows a block diagram illustrating exemplary details for another portion of FIG. 12 in accordance with an embodiment of the present invention.

FIG. 17 shows a block diagram illustrating exemplary implementation details for one interface circuit 1204 (one sysHSI Block in FIG. 12) in accordance with an embodiment of the present invention. In this example, interface circuit 1204 provides high speed serial data transfer capability over a pair of LVDS input/output paths. Each SERDES block (i.e., SERDES (HIS#A) and SERDES (HIS#B)) receives a single high speed serial data input stream (with embedded clock) from an input (SIN) and provides a low speed 10-bit wide data stream and a recovered clock.

For transmitting, each of the SERDES blocks converts a 10-bit wide low speed data stream to a single high speed data stream with embedded clock for an output (SOUT). Additionally, multiple interface circuits 1206 can be grouped together to form a source synchronous interface of various channels (e.g., 1–10). Further details regarding the specific implementation discussed in reference to FIGS. 12 through 17 may be found in the Preliminary Data Sheet entitled "ispXPGA Family" dated March 2003 by Lattice® Semiconductor Corporation.

Embodiments described above illustrate but do not limit the invention. It should also be understood that numerous modifications and variations are possible in accordance with the principles of the present invention. Accordingly, the scope of the invention is defined only by the following claims.

We claim:

1. A programmable logic device comprising:
    input/output buffers adapted to programmably support a plurality of signal types;
    a serializer deserializer circuit adapted to receive a serial input data stream and extract a clock and provide a parallel data output signal and further adapted to receive a parallel data input signal and provide a serial output data stream; and
    a programmable interconnect adapted to selectively couple the input/output buffers to the serializer deserializer circuit.

2. The programmable logic device of claim 1, wherein the programmable interconnect couples the input/output buffers to the serializer deserializer circuit to route signals through the serializer deserializer circuit when the signals exceed a clock rate of a core logic of the programmable logic device, and decouples the input/output buffers from the serializer deserializer circuit to bypass the serializer deserializer circuit when the signals are within the clock rate of the core logic.

3. The programmable logic device of claim 1, wherein the signal types supported include at least LVTTL, LVCMOS, PCI, PCI-X, SSTL, HSTL, GTL+, CTT, BLVDS, LVDS, and LVPECL.

4. The programmable logic device of claim 1, wherein the serializer deserializer circuit comprises:
    a first receiver having a deserializer and a clock and data recovery function;
    a first transmitter, associated with the first receiver, having a serializer function;
    a second receiver having a deserializer and a clock and data recovery function; and
    a second transmitter, associated with the second receiver, having a serializer function.

5. The programmable logic device of claim 4, wherein the serializer deserializer circuit further comprises a phase-locked loop circuit adapted to provide a high speed clock for the serializer deserializer circuit.

6. The programmable logic device of claim 5, wherein the programmable interconnect couples the input/output buffers to the serializer deserializer circuit when high speed serial data transfer capability is required over differential signal input/output paths.

7. The programmable logic device of claim 1, further comprising a memory, the programmable interconnect selectively couples the memory to the input/output buffers.

8. The programmable logic device of claim 7, wherein the memory provides synchronization support.

9. The programmable logic device of claim 7, wherein the memory comprises RAM, ROM, FIFO, single-port, or dual-port memory.

10. A programmable interface circuit, within a programmable logic device, comprising:
    input/output buffers adapted to support a number of input/output signal types;
    means for providing serializer/deserializer and clock and data recovery; and means for programmably coupling the providing means to the input/output buffers for high-speed serial signal streams transferred through the input/output buffers which exceed a core clock rate of the programmable logic device.

11. The programmable interface circuit of claim 10, wherein the input/output signal types include single-ended signals and differential signals.

12. The programmable interface circuit of claim 10, further comprising a memory, wherein the coupling means programmably couples the memory to the input/output buffers to provide synchronization functions.

13. The programmable interface circuit of claim 12, wherein the coupling means decouples the providing means from the input/output buffers and routes signals transferred through the input/output buffers between the input/output buffers and the memory or a core logic of the programmable logic device when a rate of the signals is within the core clock rate.

14. The programmable interface circuit of claim 13, wherein the core logic implements logic, memory, arithmetic, or register functions.

15. The programmable interface circuit of claim 10, wherein the providing means comprises a pair of serializer deserializer circuits and a phase-locked loop.

16. The programmable interface circuit of claim 10, wherein the coupling means comprises a pair of input/output blocks and a switch matrix.

17. A method of providing a programmable interface for a programmable logic device, the method comprising:
providing buffers adapted to programmably transfer a number of different signal types to and from the programmable logic device; and
providing a programmable interconnect to selectively couple or decouple an interface circuit, having serializer, deserializer, and clock and data recovery capability, to the buffers depending upon the signal type.

18. The method of claim 17, wherein the signal types comprise single-ended signals and differential signals.

19. The method of claim 18, wherein the programmable interconnect couples the interface circuit to the buffers when the signal type is a differential signal that exceeds a core clock rate of the programmable logic device, and decouples the interface circuit when the signal type does not exceed the core clock rate.

20. The method of claim 19, further comprising providing memory adapted to programmably couple to the programmable interconnect.

* * * * *